United States Patent
Tellkamp

(10) Patent No.: US 7,413,934 B2
(45) Date of Patent: Aug. 19, 2008

(54) LEADFRAMES FOR IMPROVED MOISTURE RELIABILITY AND ENHANCED SOLDERABILITY OF SEMICONDUCTOR DEVICES

(75) Inventor: John P Tellkamp, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/774,914

(22) Filed: Jul. 9, 2007

(65) Prior Publication Data

US 2008/0014757 A1  Jan. 17, 2008

Related U.S. Application Data

(62) Division of application No. 11/290,111, filed on Nov. 30, 2005, now Pat. No. 7,256,481.

(51) Int. Cl.
H01L 21/44 (2006.01)
(52) U.S. Cl. .................. 438/123; 257/666
(58) Field of Classification Search ............. 438/111, 438/123; 257/666, 672, 748, E33.066, E23.043, 257/E23.052, E23.053, E23.054
See application file for complete search history.

(56) References Cited

U.S. PATENT DOCUMENTS

| 5,635,755 A | 6/1997 | Kinghorn |
| 5,675,177 A | 10/1997 | Abys et al. |
| 5,777,382 A | 7/1998 | Abbott et al. |
| 5,882,955 A * | 3/1999 | Huang et al. ............ 438/111 |
| 6,034,422 A | 3/2000 | Horita et al. |
| 6,583,500 B1 | 6/2003 | Abbott et al. |
| 6,593,643 B1 | 7/2003 | Seki et al. |
| 6,953,986 B2 | 10/2005 | Abbott et al. |
| 7,148,085 B2 * | 12/2006 | Abbott et al. ............ 438/123 |

* cited by examiner

*Primary Examiner*—David Vu
(74) *Attorney, Agent, or Firm*—Yingsheng Tung; Wade James Brady, III; Frederick J. Telecky, Jr.

(57) ABSTRACT

A semiconductor device has a leadframe with a structure made of a base metal (105), wherein the structure consists of a chip mount pad (302) and a plurality of lead segments (303). Covering the base metal are, consecutively, a continuous nickel layer (201) on the base metal, a layer of palladium on the nickel, wherein the palladium layer (203) on the chip side of the structure is thicker than the palladium layer (202) opposite the chip, and a gold layer (204) on the palladium layer (202) opposite the chip. A semiconductor chip (310) is attached to the chip mount pad and conductive connections (312) span from the chip to the lead segments. Polymeric encapsulation compound (320) covers the chip, the connections, and portions of the lead segments, but leaves other segment portions available for solder reflow attachment to external parts.

7 Claims, 3 Drawing Sheets

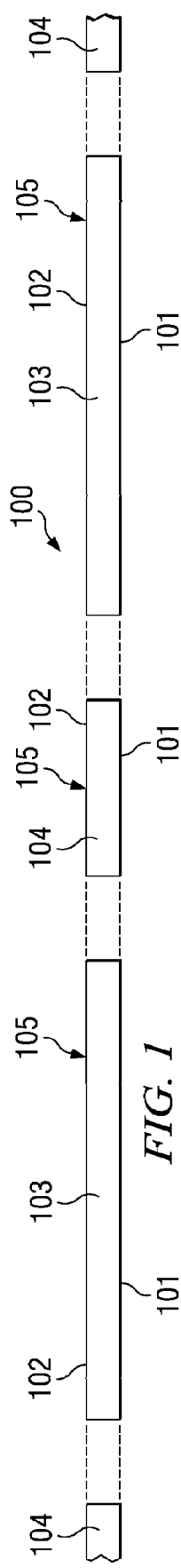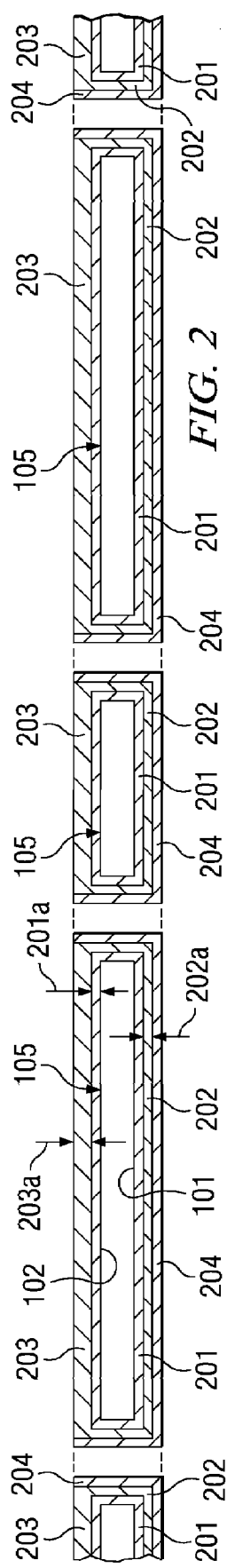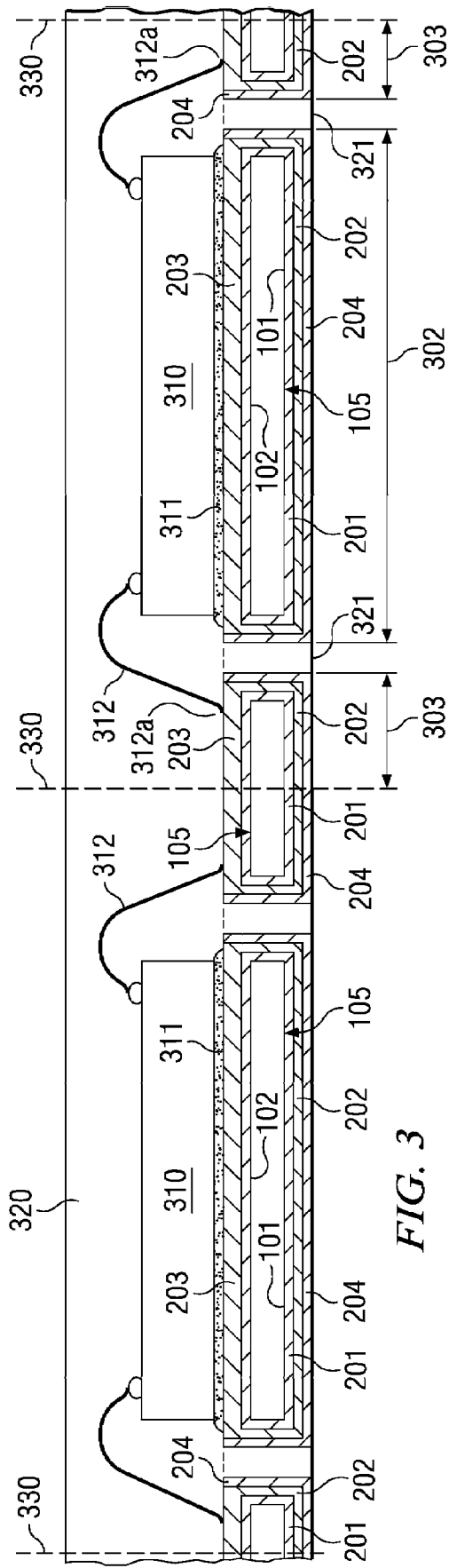
FIG. 1
FIG. 2
FIG. 3

LEADFRAMES FOR IMPROVED MOISTURE RELIABILITY AND ENHANCED SOLDERABILITY OF SEMICONDUCTOR DEVICES

This is a division of co-pending application Ser. No. 11/290,111 filed Nov. 30, 2005, the contents of which are herein incorporated by reference in its entirety.

FIELD OF THE INVENTION

The present invention is related in general to the field of semiconductor devices and processes, and more specifically to the materials and fabrication of leadframe finishes for integrated circuit devices and semiconductor components.

DESCRIPTION OF THE RELATED ART

Leadframes for semiconductor devices provide a stable support pad for firmly positioning the semiconductor chip, usually an integrated circuit (IC) chip, within a package. It has been common practice to manufacture single piece leadframes from thin (about 120 to 250 µm) sheets of metal. For reasons of easy manufacturing, the commonly selected starting metals are copper, copper alloys, iron-nickel alloys (for instance the so-called "Alloy 42"), and aluminum. The desired shape of the leadframe is stamped or etched from the original sheet.

In addition to the chip pad, the leadframe offers a plurality of conductive segments to bring various electrical conductors into close proximity of the chip. The remaining gaps between the inner end of the segments and the contact pads on the IC surface are bridged by connectors, typically thin metal wires such as gold individually bonded to the IC contact pads and the leadframe segments. Consequently, the surface of the inner segment ends has to be metallurgically suitable for stitch-attaching the connectors.

The end of the lead segments remote from the IC chip ("outer" ends) need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts.

Finally, the leadframe provides the framework for encapsulating the sensitive chip and fragile connecting wires. Encapsulation using plastic materials, rather than metal cans or ceramic, has been the preferred method due to low cost. The transfer molding process for epoxy-based thermoset compounds at 175° C. has been practiced for many years. The temperature of 175° C. for molding and mold curing (polymerization) is compatible with the temperature of >200° C. for eutectic solder reflow.

Reliability tests in moist environments require that the molding compounds have good adhesion to the leadframe and the device parts it encapsulates. Two major contributors to good adhesion are the chemical affinity between the molding compound and the metal finish of the leadframe, and the surface roughness of the leadframe.

In recent years, a number of technical trends have made it more and more complicated to find a satisfactory solution for the diverse requirements. As an example, the package dimensions are shrinking, offering less surface for adhesion. Then, the requirement to use lead-free solders pushes the reflow temperature range into the neighborhood of about 260° C., making it more difficult to maintain mold compound adhesion to the leadframes. This is especially true for the very small leadframe surface available in QFN (Quad Flat No-lead) and SON (Small Outline No-lead) devices.

In addition, market pressures push for cost reduction of leadframes and thus emphasize the reduction of any costly metal used for the leadframe. This is especially true for the amount of any noble metal, which might be customarily used in leadframes, such as gold or palladium, is to be minimized.

SUMMARY OF THE INVENTION

Applicant recognizes the need for a fresh concept of achieving low-cost device fabrication using leadframe structures tailor-made for high reliability of semiconductor devices. The low-cost leadframes are to offer a combination of adhesion to molding compounds, bondability for connecting wires, solderability of the exposed leadframe segments, and no risk of tin dendrite growth.

There are technical advantages, when the leadframe and its method of fabrication are flexible enough to be applied for different semiconductor product families and a wide spectrum of design and assembly variations, and achieve improvements toward the goals of improved process yields and device reliability. There are further technical advantages, when these innovations are accomplished using the installed equipment base so that no investment in new manufacturing machines is needed and the innovative processes lead to increased throughput and cycle time reduction.

One embodiment of the invention is a leadframe strip with a structure made of a sheet of base metal, wherein the sheet has first and second surfaces. A continuous metal layer, preferably nickel, is in contact with the first and second sheet surfaces. The nickel layer thickness ranges from 0 to about 2 µm. A first layer of a first noble metal, preferably palladium, is in contact with the metal layer on the first sheet surface; this first layer has a thickness, preferably about 10 nm. A second layer of the first noble metal is in contact with the metal layer on the second sheet surface; this second layer has a thickness greater than the thickness of the first layer, preferably about 75 nm. A layer of a second noble metal, preferably gold, is in contact with the first layer of the first noble metal.

Another embodiment of the invention is a semiconductor device, which has a leadframe with a structure made of a base metal, wherein the structure includes a chip mount pad and a plurality of lead segments, and the sheet has first and second surfaces. Covering the base metal surfaces is a continuous nickel layer. On the nickel layer over the first sheet surface is a first layer of palladium with a certain thickness. On the nickel layer over the second sheet surface is a second layer of palladium with a thickness greater than the layer thickness over the first sheet surface. Further, a gold layer is in contact with the palladium layer over the first sheet surface. A semiconductor chip is attached to the chip mount pad and connected to the lead segments. Polymeric encapsulation material covers the chip, the connections and portions of the lead segments.

Another embodiment of the invention is a method for fabricating a leadframe strip. A base metal sheet with first and second surfaces is provided. A continuous layer of nickel (between 0 and about 2 µm thick) is plated on the first and second sheet surfaces. Continuous layers of palladium with controlled thicknesses are concurrently plated to cover the nickel layer so that the palladium layer thickness over the second sheet surface (preferably about 75 nm) is greater than the palladium layer thickness on the first sheet surface (preferably about 10 nm). For the palladium plating in the same electrolytic tank, the base metal sheet is used as cathode, and independent anodes opposite to the first and second sheet surfaces are placed so that the that the palladium layer thickness over each sheet surface is determined by at least one process control selected from anode potential, anode spacing, anode length, anode shielding, and bath fluid flow. Further, a layer of gold (preferably about 3 nm thick) is plated to cover the palladium layer over the first sheet surface.

It belongs to the technical advantages of the invention that no toxic or whiskering materials are used for the plating steps, down-bonding capability is enhanced, adhesion to molding compounds is enhanced, and moisture-level device quality is improved. Furthermore, the required plating processes are inexpensive and easy to manufacture.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic cross section of the base metal structure of a portion of a leadframe strip with formed leadframe structures.

FIG. 2 illustrates a schematic cross section of a leadframe strip portion with a base metal structure and plurality of surfaces, wherein the surfaces have been plated with a stack of adherent layers according to an embodiment of the invention.

FIG. 3 illustrates a schematic cross section of a device embodiment of the invention, showing a portion of a leadframe strip, prepared according an embodiment of the invention, and a plurality of semiconductor chips assembled and encapsulated on one leadframe surface.

FIG. 6, controlling the nickel layer including an alloy interliner;

FIG. 7, controlling palladium layer by anode spacing;

FIG. 8, controlling palladium layer by anode length;

FIG. 9, controlling palladium layer by anode shielding.

DETAILED DESCRIPTION OF THE PREFERRED EMBODIMENTS

Figure 4:
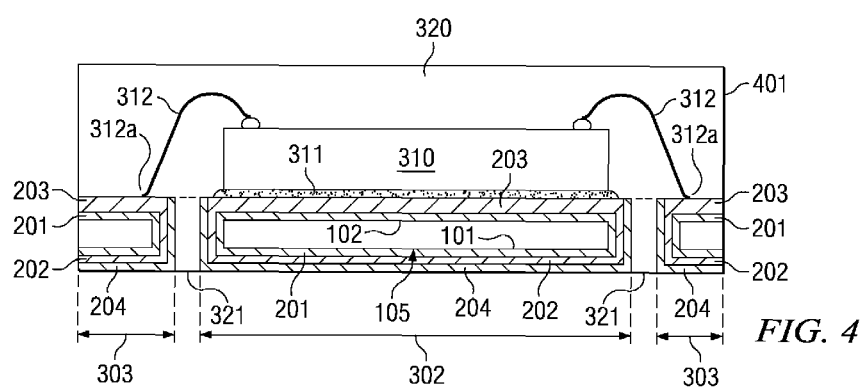
FIG. 4 illustrates a schematic cross section of a singulated device of the QFN/SON type, which includes a leadframe prepared according to the invention.

FIG. 1 illustrates a schematic cross section of a leadframe portion generally designated 100, which is intended to be used on the fabrication of a semiconductor device. The leadframe has a structure made from a sheet of metal by stamping or etching, wherein the sheet has a first surface 101 and a second surface 102. In the example of FIG. 1, the leadframe portion depicted contains a plurality of portions 103, which are intended to become chip mount pads, and a plurality of portions 104, which are intended to become the lead segments of the device-to-be-built. The leadframe is made of a base metal 105.

As defined herein, the starting material of the leadframe is called the "base metal", indicating the type of metal. Consequently, the term "base metal" is not to be construed in an electrochemical sense (as in opposition to 'noble metal') or in a structural sense.

Base metal 105 is typically copper or a copper alloy. Other choices include brass, aluminum, iron-nickel alloys ("Alloy 42"), and Kovar.

Base metal 105 originates with a metal sheet in the preferred thickness range from 100 to 300 µm; thinner sheets are possible. The ductility in this thickness range provides the 5 to 15% elongation that facilitates the segment bending and forming operation needed for some of the finished devices (for instance, for surface mount devices). The leadframe parts such as chip mount pads, lead segments, connecting rails (not shown in FIG. 1, but hinted at by dashed lines) are stamped or etched from the starting metal sheet.

FIG. 2 illustrates a leadframe strip according to an embodiment of the invention. The leadframe structure made of a sheet base metal 105 by the process of stamping or etching; the sheet has first surface 101 and second surface 102. The preferred metal for the base is copper or a copper alloy. As stated above, alternatively the base metal is selected from a group consisting of aluminum, an iron-nickel alloy (such as Alloy 42), and Kovar.

A continuous metal layer 201 adheres to the first and second sheet surfaces. In one embodiment, metal layer 201 is made of nickel and has a thickness 201a in the range from 0 to about 2 µm. As FIG. 2 points out, layer 201 has substantially the same thickness 201a on the first (101) and on the second (102) sheet surface. In another embodiment, a palladium/nickel alloy interliner is added to the nickel layer for additional corrosion protection. In this embodiment, the sequence of layers, starting from the base metal surface, is as follows: Layer of nickel as seed layer adherent to the base metal (thickness for example 2 to 5 nm); layer of nickel/palladium alloy, adherent to the seed layer (thickness for example 2 to 10 nm); and layer of nickel in the thickness range from about 0.5 to 2 µm.

A continuous layer of a first noble metal adheres to metal layer 201; the preferred first noble metal is palladium. This noble metal layer has two distinct thicknesses and may thus be best described as two layers 202 and 203. Layer 202 adheres to layer 201 on the first sheet surface 101 and has a thickness 201a preferably in the range from about 5 to 15 nm with a most preferred thickness of about 10 nm.

Layer 203 adheres to layer 201 on the second sheet surface 102 and has a thickness 202a preferably in the range from about 20 to 100 nm with a most preferred thickness of about 75 nm. Layer 203 has a thickness greater than the thickness of layer 202.

In contact with layer 202 of the first noble metal is a layer 204 of a second noble metal; the preferred second noble metal is gold in the thickness range from about 2 to 5 nm with a most preferred thickness of about 3 nm.

Although both noble metal layers 202 and 204 are thin, the stack of both layers is substantially pinhole-free in order to provide an unoxidized nickel surface for uniform and reliable solderability of the finished device, which incorporates the leadframe. The noble metal layer 203 provides strong and reliable adhesion to polymerized molding compounds, which are preferably used for device encapsulation; palladium is the preferred metal for adhesion to plastic encapsulants. Layer 203 further supports good bondability for reliable wire stitch bonding, especially for gold bond wires.

Since all leadframe surfaces are covered by the stack of metal layers, the preferred layer deposition process is electrolytical plating. The whole leadframe strip is moved through a consecutive array of plating baths (see detail below)

and masking steps can be avoided. Alternatively, electroless plating may be chosen for certain device types, or for post-molding processes.

Another embodiment of the invention is a semiconductor device, such as a surface mount device with bent leads protruding from the encapsulation containing the chip, or a Quad Flat No-leads (QFN) or Small Outline No-leads (SON) device, as exemplified in FIG. 3 still in strip form. FIG. 3 shows a leadframe strip with a plurality of assembled and packaged devices before device singulation. In the embodiment of the invention, the device has a leadframe with a structure made from a sheet of base metal 105; the sheet has a first surface 101 and a second surface 102. A preferred example for the base metal is copper or copper alloy. The leadframe structure in FIG. 3 includes a chip mount pad 302 and a plurality of lead segments 303.

The first sheet surface 101 and the second sheet surface 102 are covered by a stack of layers, which provides the leadframe with reliable adhesion to polymeric materials and metallurgical affinity to bonding wire metals and reflow metals. In the example shown in FIG. 3, the stack of layers begins with a continuous nickel layer 201 in contact with the base metal 105. For added corrosion protection, an interliner may be employed consisting of a nickel seed layer on the base metal 105 followed by an adherent nickel-palladium alloy layer; adherent to the alloy layer, in turn, is the nickel 201 layer described above.

Adherent to the nickel layer 201 is a continuous layer of a first noble metal, preferably palladium. This noble metal layer has two distinct thicknesses and may thus be best described as two layers 202 and 203. Layer 202 adheres to layer 201 on the first sheet surface 101 and has a thickness preferably in the range from about 5 to 15 nm with a most preferred thickness of about 10 nm. Layer 203 adheres to layer 201 on the second sheet surface 102 and has a thickness preferably in the range from about 20 to 100 nm with a most preferred thickness of about 75 nm. Layer 203 has a thickness greater than the thickness of layer 202. In addition, an outermost gold layer 204 is on the palladium layer 202.

A semiconductor chip 310, for example a silicon integrated circuit chip, is attached by means of an adhesive layer 311 to each chip mount pad 302. Conductive connections 312, such as bonding wires made of gold or gold alloy, span from chip 310 to the lead segments 303 in order to interconnect the chip with the lead segments. The stitch bonds 312a are pressure bonded to the noble metal layer 203 (palladium) for reliable stitch attachment.

Polymeric encapsulation material 320, for example epoxy-based molding compound, covers chips 310, bonding wires 312 and the palladium layer 203 of the lead segments. The polymeric material 320 also fills the gaps between chips 310 and the lead segments. In QFN/SON devices, the polymeric compound 320 forms a surface 321 coplanar with (in the same plane as) the outermost gold layer 204; consequently, the polymeric material 320 leaves the outer surface of gold layer 204 not covered.

These exposed portions of the leadframe surface are thus available to be contacted by solder reflow metals. As an example, tin or a tin alloy may cover portions or all of the lead segments and the exposed outer chip pad surface. Reflow metals serve to interconnect, mechanically and electrically, the semiconductor device to an external part such as a circuit board.

In FIG. 3, dashed lines 330 indicate the locations, where a saw will separate (singulate) the completed leadframe strip into individual devices of the QFN/SON package type. The saw is cutting through encapsulation material 320 as well as through the leadframe segments. A resulting singulated QFN/SON device with straight sides 401 is illustrated in FIG. 4. In surface mount devices, standard trimming and forming steps replace the cutting step with a saw.

Figure 5:
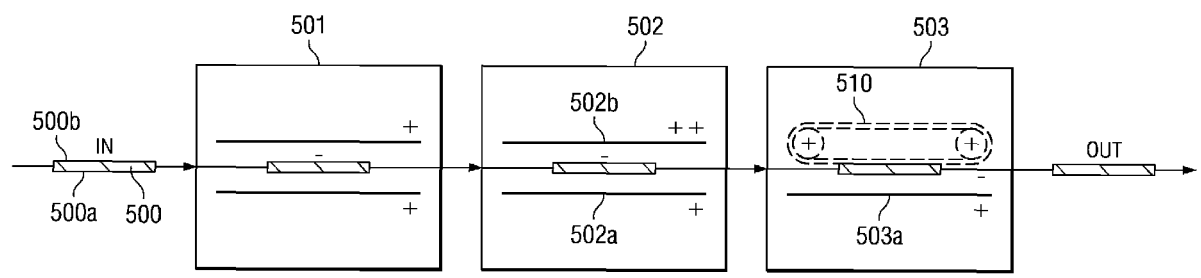
FIG. 5 illustrates schematically the series of electrolytic tanks for plating the nickel, palladium, and gold layers on the leadframe base metal sheet according to an embodiment of the invention. Plating control: anode potential.

Referring now to FIG. 5, another embodiment of the invention is a method for fabricating a leadframe strip, which starts with the step of providing a structured base metal sheet 500 with first (500a) and second (500b) surfaces, and continues with the steps of plating metal layers on these surfaces. For many device types, electrolytic plating of the leadframe strips is the preferred method. Other device types may require electroless plating. As an example, in order to fabricate the leadframe strip of FIG. 2 for use in the QFN/SON devices of FIGS. 3 and 4, the sequence of the consecutive plating steps using electrolytic technology is illustrated in FIGS. 5 to 9, highlighting a number of possible controls.

FIG. 5 displays a basic line of plating tanks for the base metal sheet with first and second surfaces. Each tank contains two independent anodes opposite the first and second sheet surfaces, while the leadframe strip serves as the cathode (controls for bath fluid flow and fluid temperature are not emphasized in FIG. 5). The process starts at "In" by inserting leadframe strip 500 into tank 501 for plating a nickel layer of uniform thickness on the first and second surfaces of the base metal sheet; preferred layer thickness range is from about 0.5 to 2.0 µm. For leadframes, which do not need a nickel layer (zero nickel layer thickness), tank 501 may be skipped.

The process continues by plating palladium in tank 502 on the nickel layer so that the palladium layer over the second base sheet surface 500b is thicker than the palladium layer over the first base sheet surface 500a. According to the invention, there is a plurality of control means for concurrent palladium plating to achieve different predetermined layer thicknesses. For effective actual control of the plating process, at least one of these control means is selected. FIG. 5 displays the control of the potentials of the independent anodes. The potential on anode 502b over the second sheet surface is greater than the potential on anode 502a over the first sheet surface, resulting in a greater palladium thickness on the second sheet side. The palladium layer thickness over the second sheet surface 500b is between about 20 and 100 nm, preferably about 75 nm, while the thickness over the first sheet surface 500a is between about 5 and 15 nm, preferably about 10 nm.

The process concludes by plating gold in tank 503. Since gold plating is desired on the first sheet surface only, using anode 503a, the second strip sheet side is shielded or masked with a flat universal protection 510. An effective shield may be stationary or belt-type as indicated in FIG. 5. The gold thickness on the first sheet side is between about 2 to 5 nm; the preferred thickness is about 3 nm. The finished leadframe strip exits the plating line at "Out".

Figure 6:
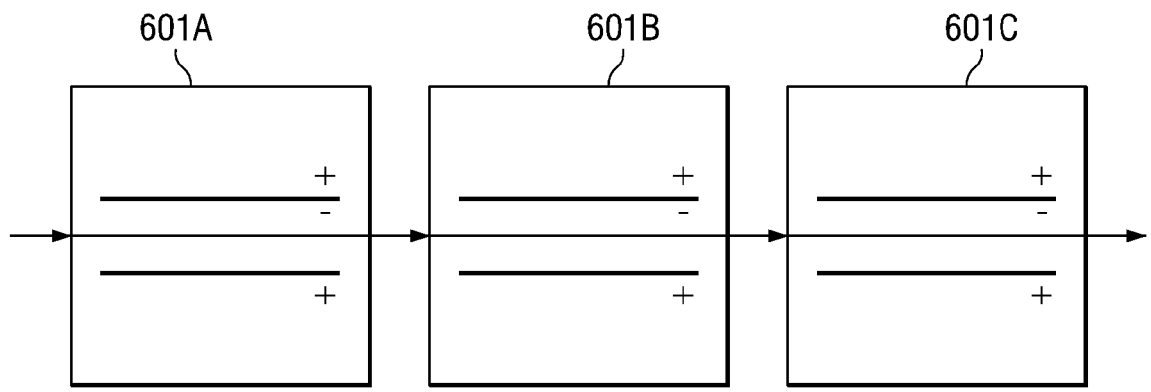
FIGS. 6 to 9 illustrate schematically modifications of the plating tanks to provide the controls needed for the plating specific metal layers according to the invention.

In FIG. 6, the first nickel plating tank (501 in FIG. 5) is separated into three plating tanks in order to plate an interliner. Tank 601A is for nickel, plating a thin seed layer about 2 to 5 nm thick; tank 601B is for nickel-palladium alloy, plating a layer about 2 to 10 nm thick; and tank 701C is for nickel, plating a layer about 0.5 to 2 µm thick. Tank 601C may be the same as tank 501.

Figure 7:
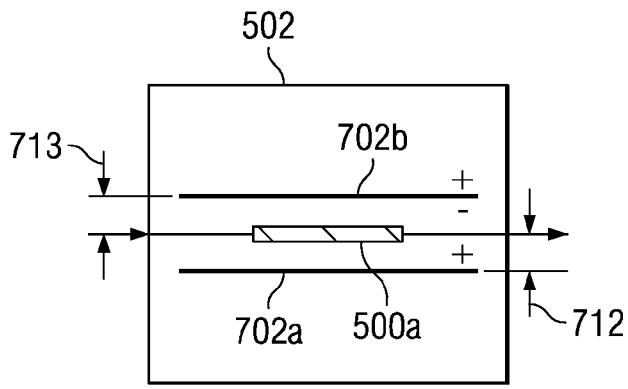

In addition to the anode potential control method used in FIG. 5 for the palladium plating tank 502, there are several other control methods for the palladium tank to achieve different palladium layer thicknesses in concurrent plating. FIG. 7 illustrates the anode spacing control in tank 502. Anode 702a has a larger distance 712 to the cathode leadframe strip than distance 713 of anode 702b and is consequently plating a thinner palladium layer on base metal sheet surface 500a.

Figure 8:
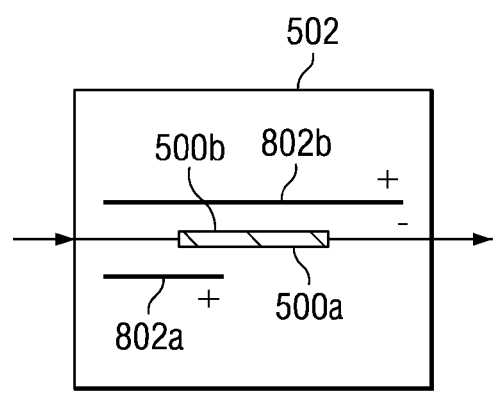

FIG. 8 illustrates the palladium tank 502 with a controlled length 802a for the anode opposite the first base metal sheet surface 500a. Anode 802a is shorter relative to anode 802b, and the palladium layer thickness plated on surface 500a will thus be less compared to the palladium layer thickness plated on surface 500b.

Figure 9:
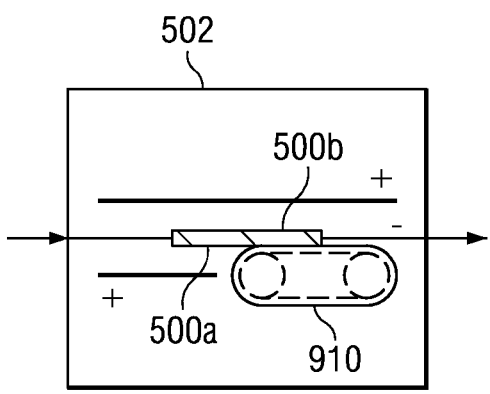

FIG. 9 illustrates the palladium tank 502 with a plating shield or belt 910 opposite the first base metal sheet surface 500a. The palladium layer thickness plated on surface 500a will thus be less than the palladium layer thickness plated on surface 500b.

Another thickness control of the plated layer is provided by controlling the bath fluid flow, including stirring of the electrolyte and controlling the bath temperature.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to many semiconductor device types other than the example of an QFN/SON devices described, for instance surface mount devices, small outline devices, and leaded devices.

As another example, the process step of stamping the leadframes from a sheet of base metal may be followed by a process step of selective etching, especially of the exposed base metal surfaces in order to create large-area contoured surfaces for improved adhesion to molding compounds. The sequence of plated layers according to the invention can accommodate any such specially etched leadframe base structures.

It is therefore intended that the appended claims encompass any such modifications or embodiment.

I claim:

1. A method for fabricating a leadframe strip comprising the steps of:
   providing a structured base metal sheet having first and second surfaces;
   plating a continuous nickel layer on the first and second sheet surfaces;
   plating a first palladium layer up to a controlled thickness to cover the nickel layer on the first sheet surface;
   concurrently plating a second palladium layer of up to a thickness greater than the first layer thickness to cover the nickel layer on the second sheet surface; and
   plating a gold layer to cover the palladium layer on the first sheet surface.

2. The method according to claim 1 further comprising the step of plating a layer of alloy interliner on the base metal surfaces before the step of plating the nickel layer, the interliner plating consisting of plating a nickel seed layer on the sheet metal surfaces, followed by plating a palladium-nickel alloy layer on the nickel seed layer.

3. The method according to claim 1 wherein the first and second palladium layers are plated concurrently in the same electrolytic tank, using the base metal sheet as cathode and placing independent anodes opposite the first and the second sheet surfaces so that the respective palladium layer thickness is determined by at least one process control selected from a group consisting of:
   controlling anode potential;
   controlling anode spacing;
   controlling anode length;
   controlling anode shielding; and
   controlling bath fluid flow.

4. The method according to claim 1 wherein the palladium layer over the first sheet surface has a thickness between about 5 and 15 nm.

5. The method according to claim 1 wherein the palladium layer over the first sheet surface is about 10 nm thick.

6. The method according to claim 1 wherein the palladium layer over the second sheet surface has a thickness between about 20 and 100 nm.

7. The method according to claim 1 wherein the palladium layer over the second sheet surface is about 75 nm thick.

* * * * *